United States Patent
Gowin, Jr. et al.

(10) Patent No.: US 6,606,721 B1
(45) Date of Patent: Aug. 12, 2003

(54) METHOD AND APPARATUS THAT TRACKS PROCESSOR RESOURCES IN A DYNAMIC PSEUDO-RANDOM TEST PROGRAM GENERATOR

(75) Inventors: Robert Douglas Gowin, Jr., Austin, TX (US); Eric T. Hennenhoefer, Austin, TX (US); Becky Cavanaugh, Austin, TX (US)

(73) Assignee: Obsidian Software, Austin, TX (US)

( * ) Notice: Subject to any disclaimer, the term of this patent is extended or adjusted under 35 U.S.C. 154(b) by 456 days.

(21) Appl. No.: 09/709,801

(22) Filed: Nov. 10, 2000

Related U.S. Application Data

(60) Provisional application No. 60/165,204, filed on Nov. 12, 1999.

(51) Int. Cl.[7] .............................................. G01R 31/28
(52) U.S. Cl. ....................................... 714/728; 714/739
(58) Field of Search ........................ 714/32, 739, 728, 714/742; 395/712, 500.42; 716/1

(56) References Cited

U.S. PATENT DOCUMENTS

| | | | |
|---|---|---|---|
| 5,202,889 A | | 4/1993 | Aharon et al. |
| 5,448,746 A | | 9/1995 | Eickemeyer et al. |
| 5,572,666 A | * | 11/1996 | Whitman ...................... 714/32 |
| 5,729,554 A | * | 3/1998 | Weir et al. ................... 714/739 |
| 5,805,470 A | | 9/1998 | Averill |
| 5,909,544 A | * | 6/1999 | Anderson, II et al. ...... 395/712 |
| 5,983,335 A | | 11/1999 | Dwyer, III |
| 6,006,028 A | * | 12/1999 | Aharon et al. ......... 395/500.42 |
| 6,477,683 B1 | * | 11/2002 | Killian et al. ................... 716/1 |

OTHER PUBLICATIONS

Park, et al., Evaluation of Scheduling Techniques on a SPARC–Based VLIW Testbed, Proceedings of the 30th Annual International Symposium on Microarchitecture, Dec. 1997.

Moreno, et al., Simulation/evaluation environment for a VLIW processor architecture, IBM Journal of Research and Development, vol. 41, No. 3 Received Aug. 8, 1996; accepted for publication Mar. 18, 1997.

(List continued on next page.)

*Primary Examiner*—David Ton
(74) *Attorney, Agent, or Firm*—Hulsey & Calkin, LLP

(57) ABSTRACT

The ability to dynamically track and output the status of selected system resources of the golden model as a function of time in processor cycles in a dynamic pseudo-random processor system test generator is described. The present invention includes a resource tracker that generates a hazard queue, a group of static data structures that detail the required resource utilization of each supported instruction, and a group of dynamic data structures that show the current state of selected system resources. The hazard queue and the appropriate resource related data structures are updated every processor cycle. Trackable resources include the architectural state of the golden model plus system resources that will cause a stall condition if unavailable such as registers, the load/store buffer, execution unit utilization, and pending branches and exceptions. The present invention can also track the physical and virtual memory systems, cache, busses, and interrupt generation.

30 Claims, 4 Drawing Sheets

OTHER PUBLICATIONS

Lichtenstein, et al., Model Based Test Generation for Processor Design Verification, Sixth Innovative Applications of Artificial Intelligence Conference, Aug. 1994.

Lichtenstein, et al., Test Program Generation for Functional Verification of PowerPC processors in IBM, IEEE/ACM 32'nd Design Automation Conference, Jun. 1995.

Aharon, et al., Verification of the IBM RISC System/6000 by a dynamic biased pseudo–random test program generator, published in IBM Systems Journal, vol. 30, No. 4, 1991.

Casaubieilh, et al., Functional verification methodology of Chameleon processor, presented at the 33rd Annual ACM IEEE Design Automation Conference, Jun. 3–7, 1996.

Bellon, et al., Automatic Generation of Microprocessor Test Programs, presented at ACM IEEE Nineteenth Design Automation Conference Proceedings, Jun., 1982.

Anderson, Logical Verification of the NVAX CPU Chip Design, Digital Technical Journal of Digital Equipment Corporation, vol. 4 No. 3, Summer 1992.

Chandra, et al., Constraint Solving for Test Case Generation—A Technique for High Level Design Verification, published in: International Conference on Computer Design: VLSI in Computers and Processors, Proceedings. Los Alamitos, IEEE Computer Society Press, 1992.

Logan, et al., Directions in Multiprocessor Verification, presented at the 14th Annual IEEE International Phoenix Conference on Computers and Communications, Mar., 1995.

Raghavan, et al., Multiprocessor System Verification Through Behavioral Modeling and Simulation, presented at the 14th Annual IEEE International Phoenix Conference on Computers and Communications, Mar., 1995.

Saha, et al., A Simulation–Based Approach to Architectural Verification of Multiprocessor Systems, presented at the 14th Annual IEEE International Phoenix Conference on Computers and Communications, Mar., 1995.

* cited by examiner

METHOD AND APPARATUS THAT TRACKS PROCESSOR RESOURCES IN A DYNAMIC PSEUDO-RANDOM TEST PROGRAM GENERATOR

This application claims the benefit of the earlier filed U.S. Provisional Pat. App. Ser. No. 60/165,204, filed Nov. 12, 1999 (12.11.99), entitled "Method and Apparatus for Processor Verification" which is incorporated by reference for all purposes into this specification.

BACKGROUND OF THE INVENTION

1. Field of the Invention

The present invention relates to the functional verification of integrated circuit hardware designs using dynamically generated pseudo-random test methodologies. In particular, the present invention provides a method and apparatus that tracks system resources in addition to the architectural state within a golden model, thus enabling instructions to be dynamically selected and generated as a function of both architectural state and system resource availability.

2. Description of the Related Art

Random test generation programs have been around since the early days of microprocessor verification. These programs automate the complex job of creating large test suites necessary for the functional verification of computer systems. From a historic perspective, functional verification has focused on two types of circuits, combinatorial and sequential. Combinatorial circuits do not contain state information, and therefore the outputs are strictly a finction of the input values. Sequential circuits contain memory elements that allow the circuit to have a current state. This makes the output values a function of both the current state and the input values. Early on, those in the industry recognized that creating purely random input values was not an adequate method of verifying sequential circuits, and a new test methodology that included the current state of the circuit was developed.

One method used to generate test patterns for processor verification that is well known in the art is to use a computer to generate a machine executable program that is assembled from instructions, control flags, and data selected from specially prepared tables. To get the expected results, the automatically-assembled test program is simulated on an existing hardware or software golden model under driver control. The test operator can change the drivers, thus changing the conditions under which the test programs are executed. This approach to testing is generally characterized as static testing, because the test patterns are assembled first, and are then executed in the simulation to get the expected results. The test pattern development process is not influenced by the intermediate machine states of the processor during the execution of the test.

While static testing is highly useful, it does have drawbacks. One obvious drawback is that tests created without knowledge of the intermediate machine states have great difficulty achieving high coverage of all the possible intermediate states. In addition, statically generated tests are restricted in that certain real-life cases can never be simulated. For example, some instructions within a statically generated instruction sequence must always be preceded by a specially-inserted data initialization instruction, which would ordinarily not appear in normal operation. Similarly, register usage can be somewhat more limited in a static simulation than it would ordinarily be in normal operation. Finally, statically generated simulations that include loops and branches must be very carefully (and therefore, artificially) constructed to avoid undesirable test results such as endless loops, branches that are never taken, and the like.

To address some of these issues, and to create a test environment that is more efficient and conducts a more robust test of very complex sequential circuits such as processors, the industry has moved toward the use of dynamically generated, biased pseudo-random test patterns. In dynamic testing, instructions are generated, all processor resources and facilities needed for executing the instruction are identified and initialized if required, the instruction is executed on a simulated processor, and the simulated processor state is updated to reflect the execution results. The process iterates, and each instruction generated at the beginning of each iteration is generated with knowledge of the processor state that resulted from the last step executed. Although there are differences in the details of how instructions are generated from test method to test method, in general, instructions are drawn from an instruction pool or tree specified by the test operator that contains the various types of instructions to be tested. In addition, many pseudo-random dynamic test generation methodologies allow the test operator to bias the instruction pool or tree, meaning that the operator can specify what percentage of the total instructions generated and simulated should be load-store instructions, what percentage should be arithmetic instructions, what percentage should be floating point instructions, and so forth. Those skilled in the art are generally familiar with the various current methods used to conduct functional verification of complex circuits using dynamically generated biased psuedo-random test patterns. Readers unfamiliar with these methods are referred to U.S. Pat. No. 5,202,889 to Aharon et al., entitled "Dynamic Process For The Generation Of Biased Pseudo-Random Test Patterns For The Functional Verification Of Hardware Designs" and the patents and publications referenced therein, which is incorporated by reference for all purposes into this disclosure. U.S. Pat. No. 5,202,889 to Aharon is a good example of the current state of the art of pseudo-random test pattern generators and their usefulness for functional verification of complex circuits.

Dynamic testing conducted in the manner described by Aharon eliminates the requirement for the cumbersome predevelopment of data tables and code streams that is necessary to achieve a high level of confidence in static testing. Also, because instructions can be automatically and iteratively generated and then simulated using an appropriately biased instruction pool, dynamic testing can also provide greater test coverage than static testing in a shorter amount of time. Nevertheless, dynamically generated tests using psuedo-random test patterns such as that described by Aharon have drawbacks and limitations as well.

For example, generating stimuli based solely upon current machine state information may not adequately test some complex processors such as Very Long Instruction Word ("VLIW") and Reduced Instruction Set Computer ("RISC") processors, which may have special rules regarding usage of certain resources. Similarly, some processor architectures allow certain groups of instructions to execute at the same architectural time. Instructions that are dynamically generated and simulated in a pseudo-random test pattern must therefore adhere to the processor's instruction grouping rules. This creates another case where the creation of input stimulus is not just a function of the current state, and therefore requires additional components in the test generator to restrict the grouping of instructions and possible operands to a given set of rules. In addition, while a dynamically generated test setup may run flawlessly on a single processor model, the same test may violate memory coherence rules when run on a multiprocessor model. Finally, the creation of highly deterministic code sequences, such as sequences that execute if then else statements and other conditional control breaks, can be problematic in dynamically generated tests. The present invention addresses the limitations of current-technology dynamic psuedo-random test pattern generators, which currently select and generate instructions based only upon current machine state. The present invention is a method and apparatus that is useful in a pseudo-random test generation setup because the present invention dynamically tracks selected system resources in a golden model, thus enabling the selection, scheduling, and simulation of instructions when generating a test to be based upon current and future system resource availability, current architectural state of the golden model, and the resource utilization rules appropriate for the architecture of the system under test. When the test generator selects an instruction for simulation on the golden model, the present invention assesses the system resources that the execution of the instruction will require as a function of time (processor cycles) and marks those resources as in use or unavailable for the appropriate amount of time. Tracking selected system resources in this manner increases the efficiency of a dynamic test generator, because the selection of instructions that require resources that are unavailable or that conflict with other pending instructions can be avoided until the resource or conflict clears. Moreover, the capability to track system resources enables the developers of dynamic pseudo-random test generators to incorporate and utilize special resource-utilization rules that some processor architectures may have, thus enabling the generation of more robust tests for these architectures. Dynamic pseudo-random test generators that include the present invention thus provide a better functional verification test of some processors, because such test generators are capable of taking into account machine state, resource availability, and instruction grouping rules in selecting and generating pseudo-random test stimuli.

SUMMARY

The present invention is a method and apparatus that dynamically tracks the status of selected system resources of the golden model in a dynamic pseudo-random test generator that generates tests for processor systems, thus providing a more robust test because the present invention can enable the test generator's instruction packer to dynamically select instructions for generation based upon the availability of system resources in addition to the processor state. Moreover, the present invention can generate time-based lists that show the historical usage and status of various system resources, thus allowing a comparison between the resource utilization of the golden model during the generation of a test and the resource utilization of the system under test when that test is run. The present invention includes a resource tracker that generates a hazard queue, wherein the availability of each system resource in a first set of selected system resources is identified as a function of time. The first set of selected system resources includes system resources the architectural state of the golden model and system resources that will cause a stall condition if unavailable, such as general purpose registers, special purpose registers, the load/store buffer, utilization of execution units, pending control branches, and pending exceptions. The resource tracker updates the hazard queue every processor cycle, and updates resource related data structures associated with resources in the hazard queue when the hazard queue indicates that the resource is changing state during the current processor cycle. The present invention also includes a static group of resource-related data structures that comprise information relating to the required resource utilization of each instruction supported by the processor system under test, and may also comprise resource-related rules dictated by the processor architecture. The resource tracker uses this static group of resource-related data structures to generate the hazard queue. The present invention is capable of generating two types of time-based lists that can be used to compare resource utilization in the golden model while a test was being generated to resource utilization in a system under test when the test generated is run on the system under test. The first list type indicates the status of each resource within said first set of system resources as a function of time in processor cycles, and the second list type indicates the status of other system resources that are tracked but not typically updated in resource-related data structures, such the physical memory system, virtual memory system, cache, system busses, and interrupts generated.

BRIEF DESCRIPTION OF THE DRAWINGS

To further aid in understanding the invention, the attached drawings help illustrate specific features of the invention and the following is a brief description of the attached drawings.

DETAILED DESCRIPTION OF THE INVENTION

The present invention is a method and apparatus that dynamically tracks selected system resources during the generation of dynamic pseudo-random tests. Tracking selected system resources in the golden model in conjunction with the test generation enables the test generator to select, schedule, and simulate instructions to be tested based upon current and future system resource availability, current architectural state of the golden model, and the resource utilization rules appropriate for the architecture of the system under test. When the test generator selects an instruction for simulation on the golden model, the present invention assesses the system resources that the execution of the instruction will require as a function of time (processor cycles) and marks those resources as in use or unavailable for the appropriate amount of time. Moreover, the present invention tracks and provides information regarding the changing state of selected system resources, as a function of time (processor cycles), as a test generator output. This enables users to compare the time-based status of certain resources as tracked on the golden model for a specific set of instructions to the same time-based status of comparable resources of a processor system under test, when the same set of instructions is executed on it. Dynamic pseudo-random test generators that include the present invention thus provide a better functional verification test of some processors, because such test generators are capable of taking into account machine state, resource availability, and instruction grouping rules in selecting and generating pseudo-random test stimuli, and because detailed information regarding the status of certain resources of the golden model measured during the test generation is available for comparison purposes when the test is run on a processor system under test.

This disclosure describes numerous specific details that include specific hardware and software structures and example instruction streams in order to provide a thorough understanding of the present invention. One skilled in the art will appreciate that one may practice the present invention without these specific details. In addition, other than the examples provided herein, details concerning the architecture and design rules associated with current advanced processors are not provided in this disclosure to avoid obfuscation of the present invention. Those skilled in the art will understand that reference herein to processor implementation rules refers to the manufacturer's rules detailed in designers' reference guides supplied by processor manufacturers, such as Texas Instruments' Instruction Set Reference Guide for the TMS320C62xx CPU, Texas Instruments (July 1997), which is incorporated into this specification by reference for all purposes.

Figure 1:
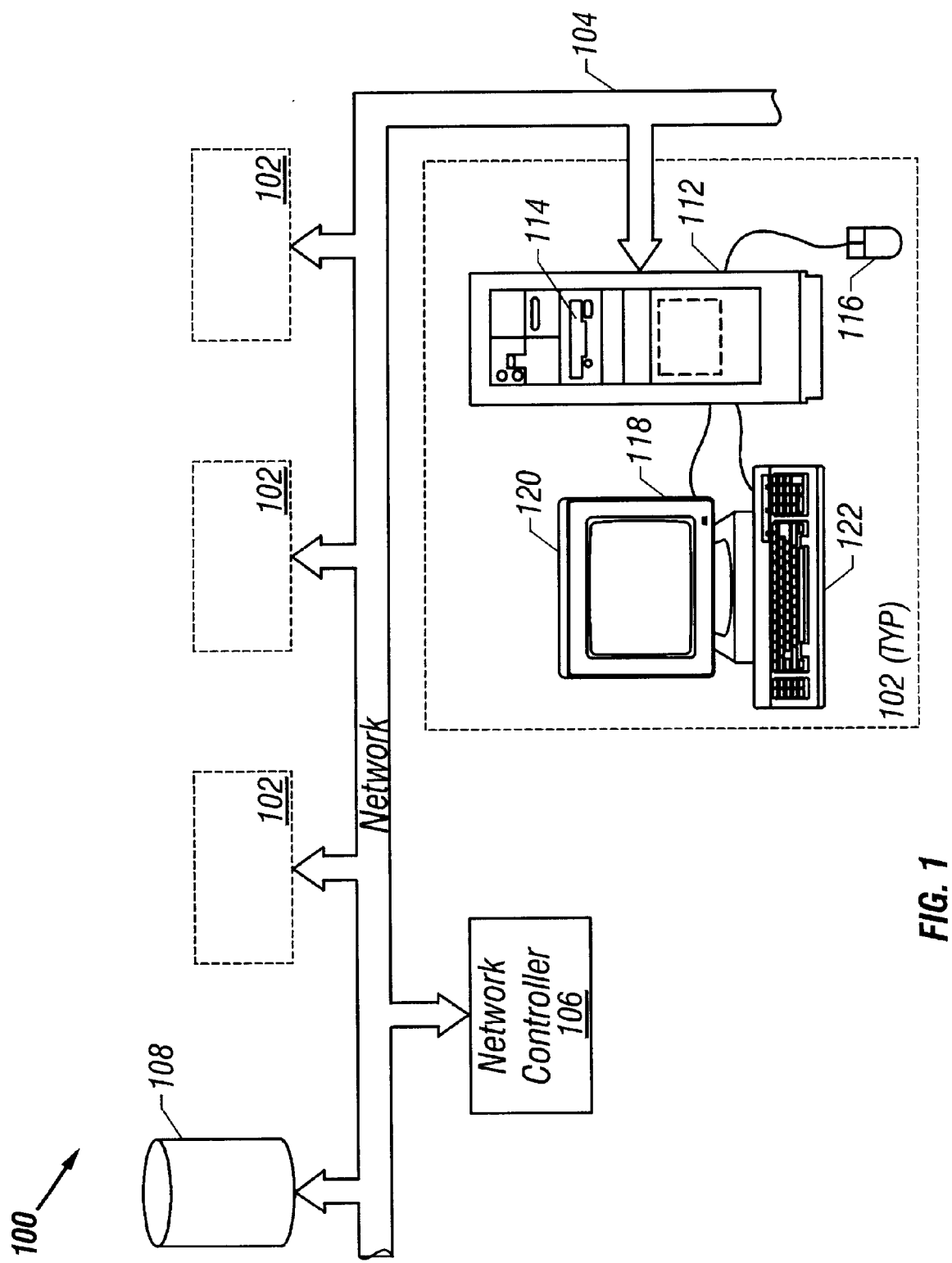
FIG. 1 shows a typical networked computer environment.

The present invention is preferably practiced in the context of a standalone or networked personal computer test setup such as that depicted in FIG. 1. In FIG. 1, typical network 100 includes one or more computer workstations 102 networked together via network connection 104, which is controlled by network controller 106. The network 100 may also include various peripheral devices, such as network storage device 108 and one or more printers (not shown in FIG. 1). Typical computer workstation 102 includes computer 112, internal storage media such as RAM 118, external storage media such as a floppy disk 114, and various interface devices such as a mouse 116, a monitor 120, and a keyboard 122. Although a particular computer may only have some of the units illustrated in FIG. 1, or may have additional components not shown, most computers will include at least the units shown.

In the embodiment described herein, the present invention is implemented in the C++ programming language. C++ is a compiled language, that is, programs are written in a human-readable script and this script is then provided to another program called a compiler, which generates a machine-readable numeric code that can be loaded into, and directly executed by, a computer. Those skilled in the art are very familiar with C++, and many articles and texts are available which describe the language in detail. While the exemplary embodiment detailed herein is described using C++ code fragments and pseudo-code, those skilled in the art will understand that the concepts and techniques disclosed herein can be practiced by test designers and operators using any higher-order programming language, such as Java, without departing from the present invention.

Figure 2:
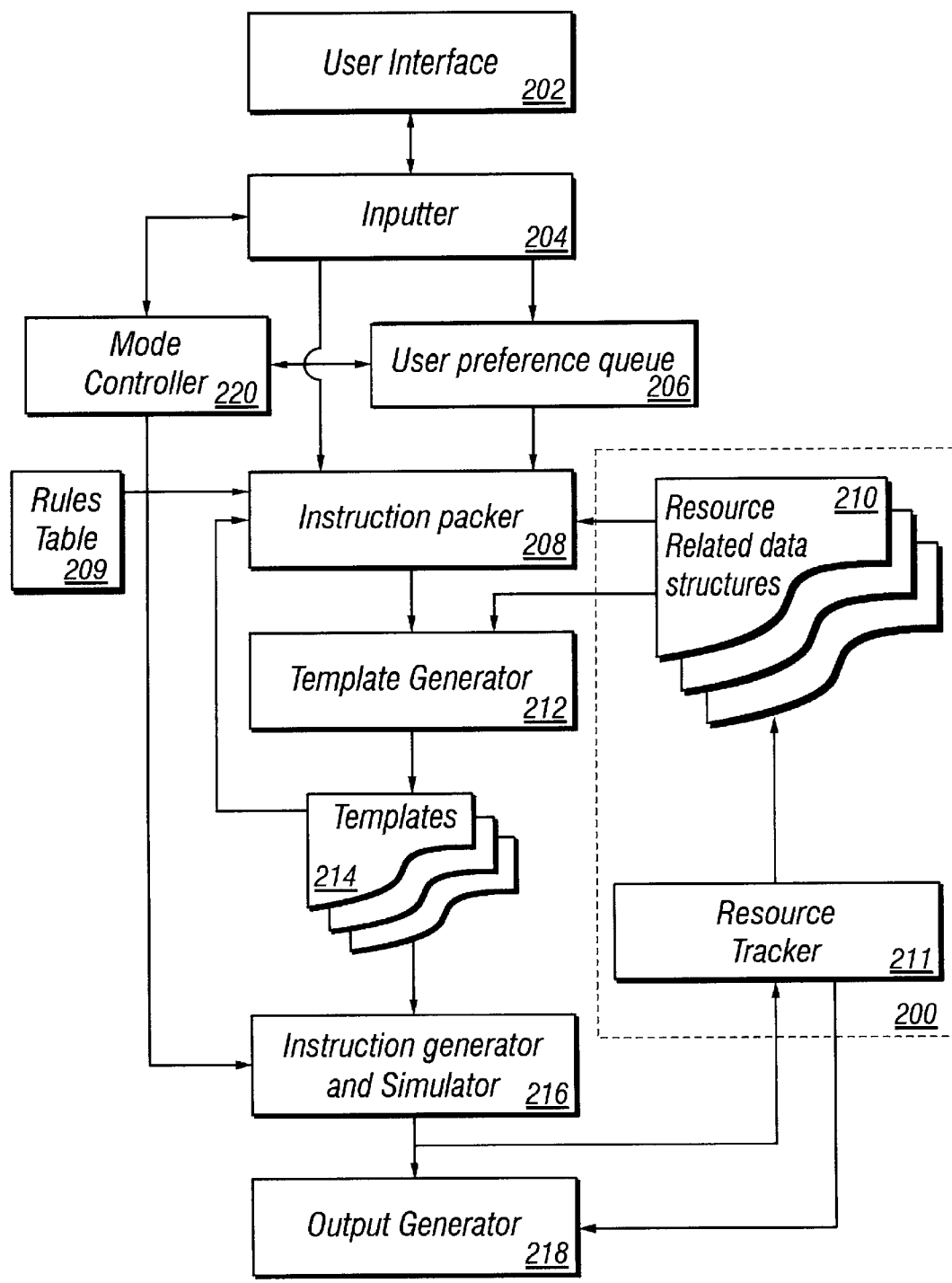
FIG. 2 shows the major components of a test generator that includes the present invention.

FIG. 2 is a high-level functional block diagram of an example test generation apparatus that includes the present invention. As shown in FIG. 2, the test generator includes a user interface 202, an inputter 204, a user preference queue 206, an instruction packer 208, a rules table 209, a template generator 212, one or more templates 214, a mode controller 220, an instruction generator and simulator 216, and an output generator 218. Those skilled in the art will recognize several typical test generator components, such as the user interface and instruction generator shown in FIG. 2, but may not recognize other components, such as the template generator and templates. Each component of the FIG. 2 test generator and its function, is described in more detail in copending patent application, U.S. Pat. App. Ser. No. 09/710,057, filed Nov. 10, 2000), entitled "Method and Apparatus that Simulates the Execution of Parallel Instructions in Processor Functional Verification Testing," (hereinafter, the "Parallel Instruction Patent") which is incorporated by reference into this specification for all purposes. FIG. 2 also shows the present invention 200, which includes a resource tracker 211 and resource-related data structures 210. In the test generator shown in FIG. 2, the present invention 200 interfaces with the test generator instruction packer 208, the template generator 212, and the output generator 218.

After reading this specification or practicing the present invention, those skilled in the art will understand that the test generation advantages provided by the present invention 200 will be best realized in a random test generator that includes an instruction packer or equivalent device such as that described in the Parallel Instruction Patent. The instruction packer described in the Parallel Instruction Patent is capable of functionally interfacing with other system elements, such as the rules table 209 and the resource-related data structures 210, to select on the fly and with "knowledge" of the current processor state, only those instructions that require system resources that either are currently available or will be available at the appropriate time and do not conflict with system resources required by other instructions that will be executed in parallel on the system under test. In other words, the present invention can be incorporated into a test generator that does not include an instruction packer or other equivalent device with the capabilities and complexity of the instruction packer described in the Parallel Instruction Patent, but the user may not realize the full capabilities of the present invention in the absence of a fairly sophisticated instruction packer.

As described in more detail in the Parallel Instruction Patent, the inputter 204 accepts test content, preference, and control information from the user via the user interface 202, and adds that information to the user preference queue 206 and the mode controller 220. Each entry in the user preference queue 206 is an instruction, a group/tree of instructions, or a generator command. When the user preference queue 206 shrinks below a threshold, additional elements are added by the inputter 204. The instruction packer 208 selects instructions for generation from the user preference queue 206 using the resource-related data structures 210 of the present invention, the rules table 209, and existing templates 214. As explained in further detail below, the resource-related data structures 210 are data structures that are created, maintained, and updated by the present invention to track the actual and/or predicted past state, present state, and future state of selected system resources. In this specification the term "system resources" is defined to include both architectural resources and conceptual resources. Architectural resources include resources like the architectural state of the processor (as defined by the state of specific registers), other registers, the load/store buffer, and the like. The term "conceptual resources" refers to resources that may not actually exist within the architectural state of the machine under test, but instead represent a simple way to represent complex interactions, such as whether or not a branch instruction is pending, or the usage of various execution units over time, or estimated bus traffic at a particular point in time.

The instruction packer 208 uses the resource-related data structures 210 to determine whether resources are currently available, or will be available, when they are needed by specific instructions. Instructions using resources that are either currently in use, or will be in use when they are required are not eligible to be selected and scheduled by the instruction packer 208.

The rules table 209 comprises a table of instruction grouping rules, as dictated by the architecture of the processor under test. For example, the rules table 209 for a VLIW processor having a single floating point execution unit would indicate that two floating point instructions cannot be packed into a single VLIW instruction packet. Those skilled in the art are very familiar with these architecturally-dictated design rules published by processor manufacturers, and the need to adhere to those rules when developing new processor systems utilizing the architectural approaches and limitations of existing processors.

The instruction packer 208, using information from the resource-related data structures 210 and the rules table 209, selects instructions for generation from the user preference queue 206. The instruction packer then sends the selected instruction(s) to the template generator 212, which generates a template 214 corresponding to each instruction. In this specification, a template 214 is a data structure that contains an instruction, plus all preferences and data required to execute the instruction. The template for each instruction in a VLIW packet also indicates that the instruction is to be executed in parallel with other instructions, in the manner specified by the processor's design rules.

After templates 214 are created, the instructions corresponding to the templates are generated and then simulated. The instruction generator and simulator 216 converts each template 214 into an instruction, initiates a step function of the architecturally correct golden model and, depending upon the architecture of the golden model and the processor system under test, sends one or more outstanding instructions to the golden model for simulation. The golden model executes the instruction(s) and updates all state information and other system resources as appropriate.

The resource tracker 214 of the present invention assesses the architectural state of the golden model and either calculates or estimates current and future resource utilization of selected system resources of the golden model as described in further detail below. In a preferred embodiment, the resource tracker maintains and refreshes resource information every processor cycle, and updates the appropriate resource-related data structures 210 every processor cycle.

The output generator 218 generates a machine readable output file containing the test program. The output test file contains the starting state for each component in the system, the commands executed as a function of time, and the intermediate and final states of the golden model as a function of time. Users can then run the output test file on a processor system under test, which provides the same test stimulus to the system under test as was provided to the golden model. Users then compare the time-based intermediate and final states of the system under test with the known correct time-based intermediate and final states of the golden model, to verify the functionality of the device or system under test. As described in more detail below, the present invention also allows users to compare time-based information regarding selected system resources, such as physical and virtual memory history, interrupt history, cache status, and other information measured and recorded while a test is generated using a golden model, with the same type of information gathered from a processor system under test when the test generated on the golden model is then run on the system under test.

Figure 3A:
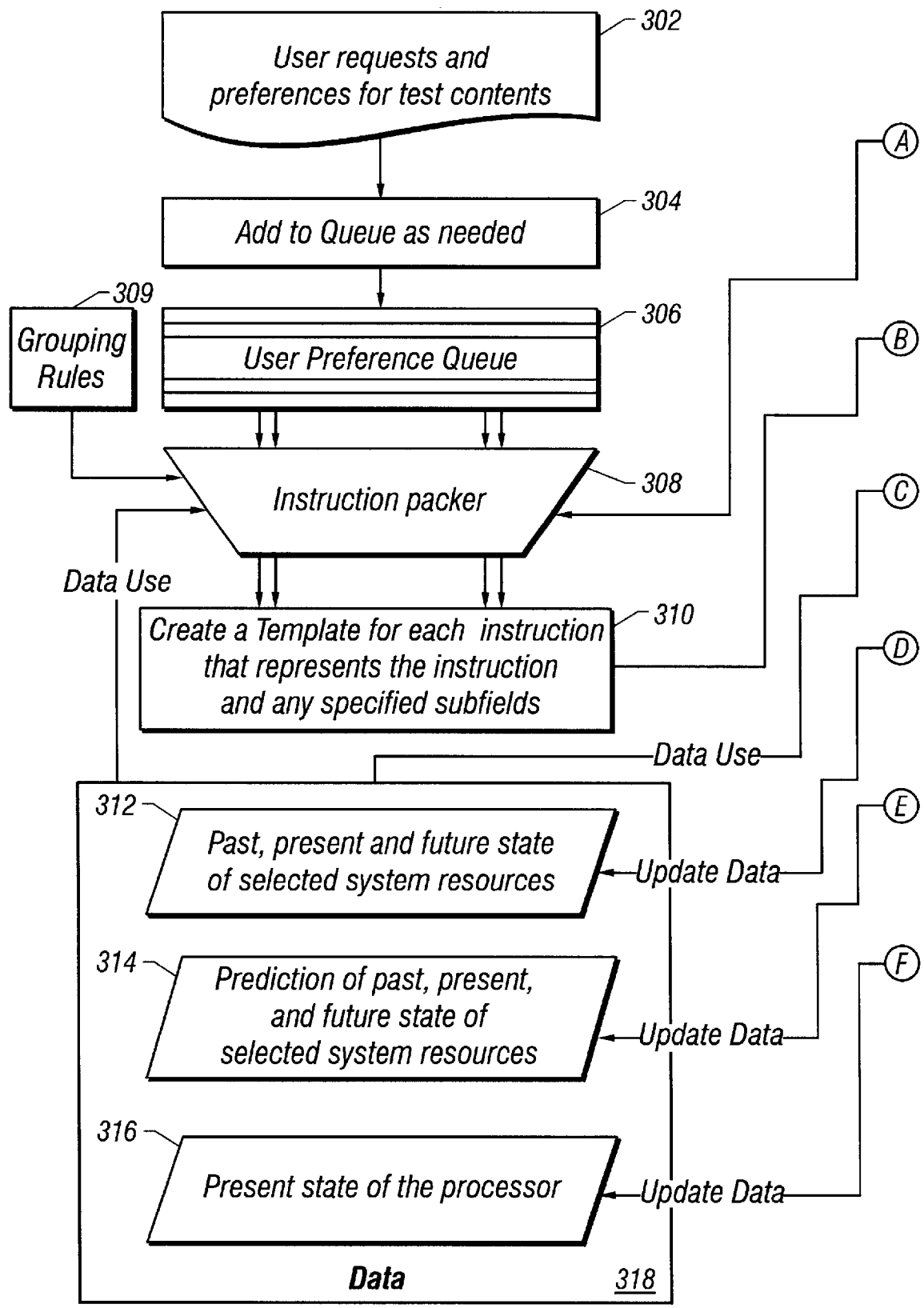
FIGS. 3A and 3B combine to form a flowchart that shows the control and operational flow of a test generator that includes the resource tracking capabilities of the present invention.
Figure 3B:
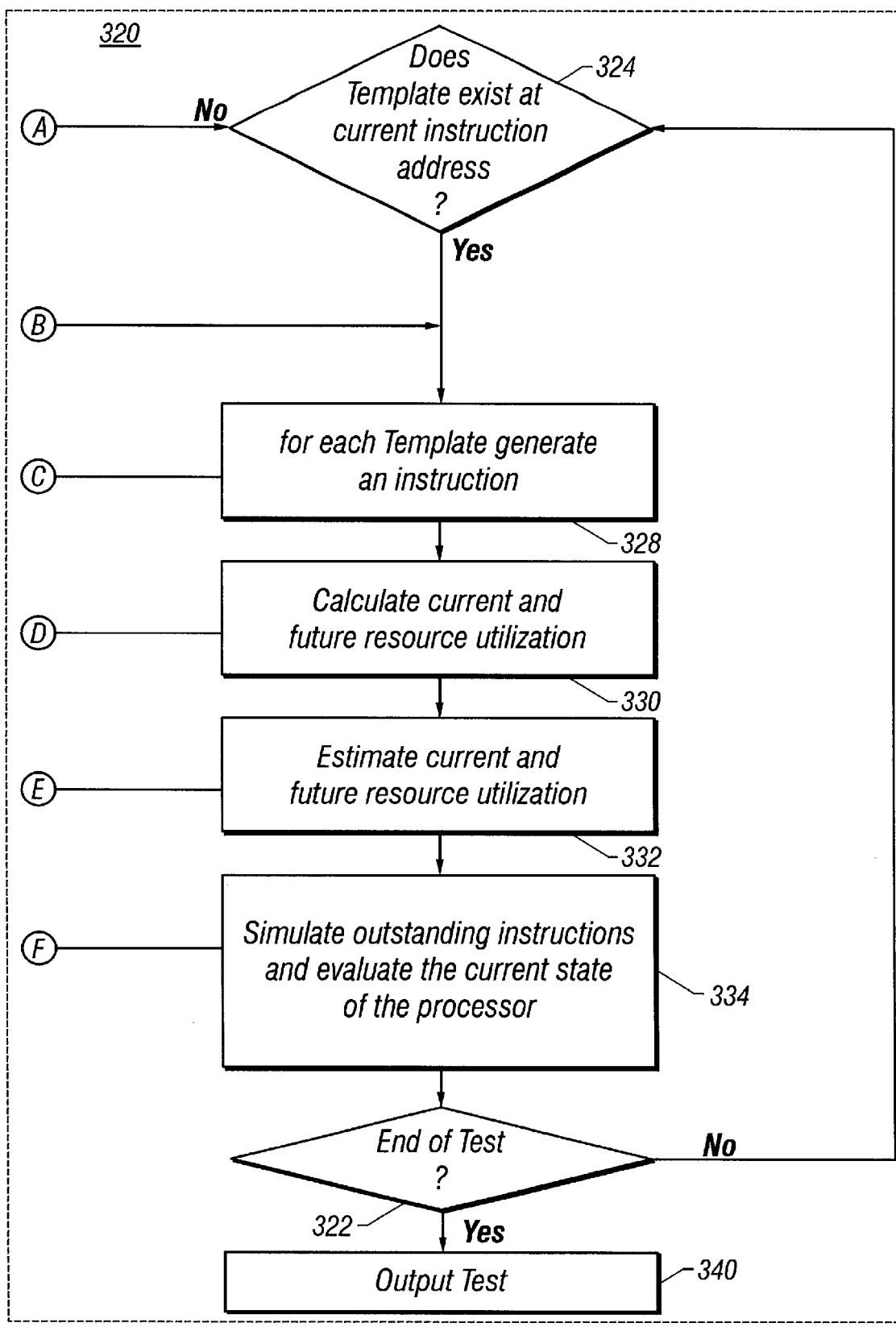

FIGS. 3A and 3B show a flowchart that illustrates the control and operational flow of a test generator that includes the present invention as it creates functional verification tests. At 302, the test operator provides the test inputs (test content, control, and preference information as described above), which are added to the user preference queue at 306 as required by 304. At 308, the instruction packer interfaces with the user preference queue 306, the resource-related data structures represented in FIG. 3A at 312, 314, and 316, and the processor grouping rules table at 309. At 310, the template generator creates a template for each instruction. The test generator then jumps to the main loop 320, shown in FIG. 3B. At 328, the instructions corresponding to all outstanding templates are generated. At 330, the resource tracker calculates the current and future resource utilization of system resources that can be directly tracked, such as register usage. At 332, the resource tracker runs and updates heuristic models that provide an estimate of the utilization of system resources that either cannot be directly tracked or are too difficult to directly track. The resource tracker updates the corresponding resource-related data structures of the appropriate system resources and other relevant data files at 312 and 314.

Instructions are then sent to the golden model at 334 for simulation, and the present invention evaluates the architectural state of the golden model and updates the resource-related data structures associated with architectural state at 316. The test generator will check for the end of the test at 322 and if there are no more instructions in the user preference queue to be simulated, the test is ended and the test generator outputs a test file at 340. If there are still instructions in the user preference queue, the test generator checks for existing templates at the current instruction address at 324, and if there are no existing templates, returns to the instruction packer at 308 for another round of instruction selection, template creation, instruction generation, and resource updating.

As discussed above, the resource tracker of the present invention tracks the current and future state and utilization of architectural resources, such as individual registers, the load/store buffer, the architectural state of the processor as defined by a specific subset of registers, and the like, as a function of time. The present invention also tracks the utilization of the various execution units within the processor, again as a function of time. For example, in an embodiment of the present invention customized to generate a test for a processor system designed according to Texas Instruments' TMS320C6xx architecture, floating point instructions require four processor cycles to complete. The present invention tracks the current utilization of the floating point execution unit, which enables the instruction packer of the test generator to select a floating point instruction only when the floating point unit is free, as indicated by the relevant floating-point execution unit data structure. Furthermore, when a floating point instruction is selected by the instruction packer, the present invention designates the floating point execution unit as unavailable for four processor cycles. Assuming a VLIW group is packed and issued during each processor cycle, the instruction packer will therefore avoid selecting another floating point instruction until four processor cycles have elapsed, at which point the floating point unit becomes available. Similarly, the destination register(s) that the floating point instruction uses are also unavailable for four processor cycles, after which they will be updated to reflect the values determined by the execution of the floating point instruction. The instruction packer will therefore avoid selecting another instruction that requires the same destination registers used by the floating point instruction until four processor cycles have elapsed. Those skilled in the art will recognize that, while neither the floating point execution unit utilization nor the values in or utilization of specific general purpose registers may be reflected in the defined architectural state within the golden model, tracking these system resources to aid in the efficient scheduling of test instructions is highly useful.

In a preferred embodiment, a practitioner of the present invention prepares one or more tables that indicate what resources are required for each instruction, and how long (processor cycles) the instruction ties up each resource. These tables are loaded as one or more static, resource-related data structures when the test generator is customized for a specific architecture. Unlike other resource-related data structures, these tables are not updated by the resource tracker while instructions are being simulated for test file generation. Similarly, practitioners of the present invention create one or more tables that include all relevant architecture-specific rules relating to specific resources. For example, some processor architectures have rules relating to general purpose register usage; i.e., general purpose register 1 cannot be read by instruction B until N number of cycles after it is written by instruction A. Again, these tables are static resource-related data structures that do not require updating during the course of a simulation.

The present invention refers to each time-based indication that a resource that is capable of causing a processor stall is changing state due to usage as a "hazard." The present invention generates and updates a hazard queue that comprises the current and predicted future state and availability of those resources that affect the selection of instructions. In other words, the hazard queue tracks resources whose unavailability will cause a processor stall if an instruction that requires that resource is attempted to be executed. When the simulation starts and the user loads instructions for simulation into the user preference queue, the instruction packer begins selecting instructions and the resource tracker begins to track system hazards by generating a time-based, time-sorted hazard queue.

To illustrate, suppose that at a given point in time, a hazard queue for an instruction stream to be simulated looks like this (for this example, assume that the processor requires a 5 cycle delay between register writes and register reads):

| Time | Hazard |
|---|---|
| Now + 3 | start read hazard on register 4 |
| Now + 6 | start write hazard on register 7 |
| Now + 8 | start write hazard on register 12 |
| Now + 8 | stop read hazard on register 4 |

This hazard queue indicates that at time now+3 processor cycles, an instruction will be writing to register 4 and thus, according to the processor's resource rules, register 4 cannot be read until 5 cycles beyond now+3, or now+8. Therefore, the present invention places a read hazard on register 4 between time now+3 and now+8. Likewise, an instruction might be reading register 7 at time now+6 and an instruction might be reading register 12 at now+8, so the present invention places write hazards on those registers at those times, to prevent the selection and scheduling of an instruction that needs to write to those registers at those times. Whenever a new hazard occurs due to the selection of a new instruction for simulation, the present invention places the hazard in the correct place in the queue. Suppose that the instruction packer selects an instruction that will tie up register 5 for 4 cycles, beginning 5 cycles from now. The present invention will place the proper start and stop hazards in the queue, at the proper places, as follows:

| Time | Hazard |
|---|---|
| Now + 3 | start read hazard on register 4 |
| Now + 5 | start write hazard on register 5 |
| Now + 6 | start write hazard on register 7 |
| Now + 8 | start write hazard on register 12 |
| Now + 8 | stop read hazard on register 4 |
| Now + 9 | stop write hazard or register 5 |

Instructions are simulated by initiating a stepping function that causes the golden model to step through the execution of instructions, one processor cycle at a time. On every cycle, the present invention acts on any hazards that have a time of "now", by updating the relevant resource-related data structures to reflect the hazard (or removal of the hazard). Additionally, the present invention decrements the cycle delay for each hazard in the queue that is scheduled in the future. If the hazard queue shown above is stepped, no action is required because the next resource update event would be at "now+2" after the step:

| Time | Hazard |
|---|---|
| Now + 2 | start read hazard on register 4 |
| Now + 4 | start write hazard on register 5 |
| Now + 5 | start write hazard on register 7 |
| Now + 7 | start write hazard on register 12 |
| Now + 7 | stop read hazard on register 4 |
| Now + 8 | stop write hazard on register 5 |

Now imagine that the clock is stepped by two cycles. The hazard queue would look like this:

| Time | Hazard |
|---|---|
| Now | start read hazard on register 4 |
| Now + 2 | start write hazard on register 5 |
| Now + 3 | start write hazard on register 7 |
| Now + 5 | start write hazard on register 12 |
| Now + 5 | stop read hazard on register 4 |
| Now + 6 | stop write hazard on register 5 |

Since there is now an item that needs attention "now" the present invention marks the resource-related data structure associated with register 4 to indicate that register 4 cannot be read from. Four steps later, register 4 frees up again, and at that time, the present invention updates the same resource-related data structure to indicate that register 4 is available for use.

While this example shows hazard tracking in the context of register usage, the present invention tracks other system resources that are directly trackable and that could cause a stall using the hazard queue. For example, the hazard queue can include entries showing start and stop times that execution units are in use and thus unavailable, or the start and stop times in which a branch instruction is pending. The hazard queue can also show at what time an exception is generated and then cleared, and the present invention updates an associated resource-related data structure accordingly. Some processors prohibit more than one exception to be pending at a time, so when the exception-related resource-related data structure shows that an exception has been generated but not yet cleared, the instruction packer would be prohibited from selecting another exception-generating instruction until the previous exception had been cleared.

When an instruction is selected, the resource tracker consults these resource-related data structures and selects only those instructions that will utilize resources that are available at the relevant point in time, and that will not violate the processor's other instruction-related rules, such as the one-exception-at-a-time rule described above. Consequently, stalls can be avoided and execution efficiency is maximized in the instruction stream generated for the resulting processor test. The present invention also maintains a time-based list of hazard state from the start to the finish of the test generation, for comparison purposes when the test is run on a processor system under test.

Unlike the execution unit utilization or specific register utilization described above, some system resources are useful to track, either to maintain efficiency in scheduling instructions or to provide a resource-related data file as a test output for comparison purposes, but cannot be as easily tracked as registers or execution units. For example, processors typically execute loads and stores from the load/store buffer on a non-interrupt, background basis. Consequently, it is difficult to determine the precise contents of the load/store buffer at a specific point in time, because it is difficult to determine at a specific instance whether pending loads and stores have been written to and from memory. Nevertheless, those skilled in the art can construct a heuristic model that represents a prediction of traffic in the load/store buffer as a function of the number and timing of load/store instructions generated in a specific test. When the predicted traffic through the load/store buffer reaches a certain predetermined threshold, the present invention can update a data structure that corresponds to the load/store buffer to designate the load/store buffer as unavailable. This will prevent the instruction packer from selecting further load/store instructions until the load/store traffic drops below the specified threshold, at which time the resource tracker redesignates the load/store buffer as available. Alternatively, the user may want to specifically test a processor's ability to function properly when the load/store buffer is highly stressed by dense traffic to and from memory. In this case, the data structure corresponding to the load/store buffer would not be marked as unavailable, and the instruction packer would continue to select and pack load/store instructions, but the user would want to continue to monitor the traffic density in the load/store buffer over time.

The present invention is also capable of tracking certain golden model resources during the generation of a test that may not be particularly relevant to the dynamic selection of instructions during test generation (unlike register and execution unit utilization, as discussed above), but that are relevant when comparing, on a cycle-by-cycle basis, the utilization of certain golden model resources to the utilization of the corresponding resources of the system under test when executing the same instructions. System physical memory and virtual memory are two examples of resources that users may want to use the present invention to track for comparison purposes. Users may want to track what values are loaded into what memory locations, to compare how the system under test moves data into and out of memory with how the golden model performs the same function. Likewise, users may want to compare how the golden model's virtual memory system functioned during the generation of a test with how the system under test's virtual memory system functioned when the test was run on it. The present invention is capable of tracking information such as page size, designation of pages as local or global, and page table entries, again on a processor cycle-by-processor cycle basis, to support a comparison for test purposes. Cache utilization as a function of time, using a heuristic model to represent the cache, and interrupt generation as a function of time are two additional resources useful to track for test comparison purposes.

System resources that practitioners of the present invention may find useful to track, either directly as described in the execution unit example, or by predictive methods as described in the load/store buffer example, include the architectural state of the golden model, general purpose registers, special purpose registers, the load/store buffer, utilization of execution units, pending control branches, pending exceptions, physical memory system, virtual memory system, cache, system busses, and interrupt generation. After practicing the invention or reading this specification, those skilled in the art may determine that system resources other than those listed here can provide useful information during and after test generation, and tracking those resources using the approaches and techniques described herein will not depart from the present invention.

To summarize, the present invention is a method and apparatus that dynamically tracks the status of selected system resources of the golden model in a dynamic pseudo-random test generator that generates tests for processor systems, thus providing a more robust test because the present invention can enable the test generator's instruction packer to dynamically select instructions for generation based upon the availability of system resources in addition to the processor state. Moreover, the present invention can generate time-based lists that show the historical usage and status of various system resources, allowing a comparison between the resource utilization of the golden model during the generation of a test and the resource utilization of the system under test when that test is run. The present invention includes a resource tracker that generates a hazard queue, wherein the availability of each system resource in a first set of selected system resources is identified as a function of time. The first set of selected system resources includes system resources the architectural state of the golden model and system resources that will cause a stall condition if unavailable, such as general purpose registers, special purpose registers, the load/store buffer, utilization of execution units, pending control branches, and pending exceptions. The resource tracker updates the hazard queue every processor cycle, and updates resource related data structures associated with resources in the hazard queue when the hazard queue indicates that the resource is changing state during the current processor cycle. The present invention also includes a static group of resource-related data structures that comprise information relating to the required resource utilization of each instruction supported by the processor system under test, and may also comprise resource-related rules dictated by the processor architecture. The resource tracker uses this static group of resource-related data structures to generate the hazard queue. The present invention is capable of generating two types of time-based lists that can be used to compare resource utilization in the golden model while a test was being generated to resource utilization in a system under test when the test generated is run on the system under test. The first list type indicates the status of each resource within said first set of system resources as a function of time in processor cycles, and the second list type indicates the status of other system resources that are tracked but not typically updated in resource-related data structures, such the physical memory system, virtual memory system, cache, system busses, and interrupts generated.

Other embodiments of the invention will be apparent to those skilled in the art after considering this specification or practicing the disclosed invention. The specification and examples above are exemplary only, with the true scope of the invention being indicated by the following claims.

We claim the following invention:

1. An apparatus that dynamically tracks the status of selected system resources of the golden model in a dynamic pseudo-random test generator that generates tests for processor systems, comprising:

a resource tracker that generates a hazard queue, wherein the availability of each system resource in a first set of selected system resources is identified as a function of time, wherein said first set of selected system resources includes system resources that will cause a stall condition if unavailable;

a first plurality of resource-related data structures that comprises information relating to the required resource utilization of each instruction supported by the processor system under test, said resource tracker uses said first plurality of resource-related data structures to generate said hazard queue; and a second plurality of resource-related data structures that indicates current availability of each system resource within said first set of selected system resources, said second plurality of resource-related data structures are periodically updated by said resource tracker.

2. The apparatus of claim 1, wherein said first set of selected system resources includes one or more of the following system resources: architectural state of the golden model, general purpose registers, special purpose registers, load/store buffer, utilization of execution units, pending control branches, and pending exceptions.

3. The apparatus of claim 1, wherein said resource tracker further generates a first list set comprising one or more time-based lists indicating the status of each resource within said first set of system resources, said first list set is provided as a test output.

4. The apparatus of claim 1, wherein during each processor cycle, said resource tracker updates said hazard queue and each said resource related data structure within said second plurality that corresponds to a system resource that changes state during the current processor cycle.

5. The apparatus of claim 1, wherein said resource tracker further generates a second list set comprising one or more time-based lists indicating the status of each system resource within a second set of system resources, wherein said second set of system resources includes one or more of the following system resources: physical memory system, virtual memory system, cache, system busses, and interrupts generated, said second list set is provided as a test output.

6. A system that dynamically tracks the status of selected system resources of the golden model in a dynamic pseudo-random test generator that generates tests for processor systems, comprising:

a resource tracker that generates a hazard queue, wherein the availability of each system resource in a first set of selected-system resources is identified as a function of time, wherein said first set of selected system resources includes system resources that will cause a stall condition if unavailable;

a first plurality of resource-related data structures that comprises information relating to the required resource utilization of each instruction supported by the processor system under test, said resource tracker uses said first plurality of resource-related data structures to generate said hazard queue; and a second plurality of resource-related data structures that indicates current availability of each system resource within said first set of selected system resources, said second plurality of resource-related data structures are periodically updated by said resource tracker.

7. The system of claim 6, wherein said first set of selected system resources includes one or more of the following system resources: architectural state of the golden model, general purpose registers, special purpose registers, load/store buffer, utilization of execution units, pending control branches, and pending exceptions.

8. The system of claim 6, wherein said resource tracker further generates a first list set comprising one or more time-based lists indicating the status of each resource within said first set of system resources, said first list set is provided as a test output.

9. The system of claim 6, wherein during each processor cycle, said resource tracker updates said hazard queue and each said resource related data structure within said second plurality that corresponds to a system resource that changes state during the current processor cycle.

10. The system of claim 6, wherein said resource tracker further generates a second list set comprising one or more time-based lists indicating the status of each system resource within a second set of system resources, wherein said second set of system resources includes one or more of the following system resources: physical memory system, virtual memory system, cache, system busses, and interrupts generated, said second list set is provided as a test output.

11. A method that makes an apparatus that dynamically tracks the status of selected system resources of the golden model in a dynamic pseudo-random test generator that generates tests for processor systems, comprising:

providing a resource tracker that generates a hazard queue, wherein the availability of each system resource in a first set of selected system resources is identified as a function of time, wherein said first set of selected system resources includes system resources that will cause a stall condition if unavailable;

providing a first plurality of resource-related data structures coupled to said resource tracker, said first plurality of resource-related data structures comprises information relating to the required resource utilization of each instruction supported by the processor system under test, said resource tracker uses said first plurality of resource-related data structures to generate said hazard queue; and providing a second plurality of resource-related data structures coupled to said resource tracker, said second plurality of resource-related data structures indicates current availability of each system resource within said first set of selected system resources, said second plurality of resource-related data structures are periodically updated by said resource tracker.

12. The method of claim 11, wherein said first set of selected system resources includes one or more of the following system resources: architectural state of the golden model, general purpose registers, special purpose registers, load/store buffer, utilization of execution units, pending control branches, and pending exceptions.

13. The method of claim 11, wherein said resource tracker further generates a first list set comprising one or more time-based lists indicating the status of each resource within said first set of system resources, said first list set is provided as a test output.

14. The method of claim 11, wherein during each processor cycle, said resource tracker updates said hazard queue and each said resource related data structure within said second plurality that corresponds to a system resource that changes state during the current processor cycle. cycle.

15. The method of claim 11, wherein said resource tracker further generates a second list set comprising one or more time-based lists indicating the status of each system resource within a second set of system resources, wherein said second set of system resources includes one or more of the following system resources: physical memory system, virtual memory system, cache, system busses, and interrupts generated, said second list set is provided as a test output.

16. A method that dynamically tracks the status of selected system resources of the golden model in a dynamic pseudo-random test generator that generates tests for processor systems, comprising:

generating a hazard queue using a resource tracker, wherein the availability of each system resource in a first set of selected system resources is identified as a function of time, wherein said first set of selected system resources includes system resources that will cause a stall condition if unavailable;

generating a first plurality of resource-related data structures that comprises information relating to the required resource utilization of each instruction supported by the processor system under test, said resource tracker uses said first plurality of resource-related data structures to generate said hazard queue; and generating a second plurality of resource-related data structures that indicates current availability of each system resource within said first set of selected system resources, said second plurality of resource-related data structures are periodically updated by said resource tracker.

17. The method of claim 16, wherein said first set of selected system resources includes one or more of the following system resources: architectural state of the golden model, general purpose registers, special purpose registers, load/store buffer, utilization of execution units, pending control branches, and pending exceptions.

18. The method of claim 16, further comprising generating a first list set comprising one or more time-based lists indicating the status of each system resource within said first set of system resources, said first list set is provided as a test output.

19. The method of claim 16, further comprising updating said hazard queue during each processor cycle, and updating each said resource related data structure within said second plurality that corresponds to a system resource that changes state during the current processor cycle.

20. The method of claim 16, further comprising generating a second list set comprising one or more time-based lists indicating the status of each system resource within a second set of system resources, wherein said second set of system resources includes one or more of the following system resources: physical memory system, virtual memory system, cache, system busses, and interrupts generated, said second list set is provided as a test output.

21. A program storage device readable by a computer that tangibly embodies a program of instructions executable by the computer to perform a method that dynamically tracks the status of selected system resources of the golden model in a dynamic pseudo-random test generator that generates tests for processor systems, comprising:

generating a hazard queue using a resource tracker, wherein the availability of each system resource in a first set of selected system resources is identified as a function of time, wherein said first set of selected system resources includes system resources that will cause a stall condition if unavailable;

generating a first plurality of resource-related data structures that comprises information relating to the required resource utilization of each instruction supported by the processor system under test, said resource tracker uses said first plurality of resource-related data structures to generate said hazard queue; and generating a second plurality of resource-related data structures that indicates current availability of each system resource within said first set of selected system resources, said second plurality of resource-related data structures are periodically updated by said resource tracker.

22. The program storage device of claim 21, wherein said first set of selected system resources includes one or more of the following system resources: architectural state of the golden model, general purpose registers, special purpose registers, load/store buffer, utilization of execution units, pending control branches, and pending exceptions.

23. The program storage device of claim 21, further comprising generating a first list set comprising one or more time-based lists indicating the status of each system resource within said first set of system resources, said first list set is provided as a test output.

24. The program storage device of claim 21, further comprising updating said hazard queue during each processor cycle, and updating each said resource related data structure within said second plurality that corresponds to a system resource that changes state during the current processor cycle.

25. The program storage device of claim 21, further comprising generating a second list set comprising one or more time-based lists indicating the status of each system resource within a second set of system resources, wherein said second set of system resources includes one or more of the following system resources: physical memory system, virtual memory system, cache, system busses, and interrupts generated, said second list set is provided as a test output.

26. An apparatus that dynamically tracks the status of selected system resources of the golden model in a dynamic pseudo-random test generator that generates tests for processor systems, comprising:

a resource tracker that generates a hazard queue, wherein the availability of each system resource in a first set of selected system resources is identified as a function of time, wherein said first set of selected system resources includes one or more of the following: system resources that will cause a stall condition if unavailable, architectural state of the golden model, general purpose registers, special purpose registers, load/store buffer, utilization of execution units, pending control branches, and pending exceptions, said resource tracker further generates a first list set and a second list set, wherein said first list set comprises one or more time-based lists indicating the status of each resource within said first set of system resources, wherein said second list set comprises one or more time-based lists indicating the status of each system resource within a second set of system resources, wherein said second set of system resources includes one or more of the following system resources: physical memory system, virtual memory system, cache, system busses, and interrupts generated, said first list set and said second list set are provided as a test output;

a first plurality of resource-related data structures that comprises information relating to the required resource utilization of each instruction supported by the processor system under test, said resource tracker uses said first plurality of resource-related data structures to generate said hazard queue; and a second plurality of resource-related data structures that indicates current availability of each system resource within said first set of selected system resources, wherein during each processor cycle, said resource tracker updates said hazard queue and each said resource related data structure within said second plurality that corresponds to a system resource that changes state during the current processor cycle.

27. A system that dynamically tracks the status of selected system resources of the golden model in a dynamic pseudo-random test generator that generates tests for processor systems, comprising:

a resource tracker that generates a hazard queue, wherein the availability of each system resource in a first set of selected system resources is identified as a function of time, wherein said first set of selected system resources includes one or more of the following: system resources that will cause a stall condition if unavailable, architectural state of the golden model, general purpose registers, special purpose registers, load/store buffer, utilization of execution units, pending control branches, and pending exceptions, said resource tracker further generates a first list set and a second list set, wherein said first list set comprises one or more time-based lists indicating the status of each resource within said first set of system resources, wherein said second list set comprises one or more time-based lists indicating the status of each system resource within a second set of system resources, wherein said second set of system resources includes one or more of the following system resources: physical memory system, virtual memory system, cache, system busses, and interrupts generated, said first list set and said second list set are provided as a test output;

a first plurality of resource-related data structures that comprises information relating to the required resource utilization of each instruction supported by the processor system under test, said resource tracker uses said first plurality of resource-related data structures to generate said hazard queue; and a second plurality of resource-related data structures that indicates current availability of each system resource within said first set of selected system resources, wherein during each processor cycle, said resource tracker updates said hazard queue and each said resource related data structure within said second plurality that corresponds to a system resource that changes state during the current processor cycle.

28. A method that makes an apparatus that dynamically tracks the status of selected system resources of the golden model in a dynamic pseudo-random test generator that generates tests for processor systems, comprising:

providing a resource tracker that generates a hazard queue wherein the availability of each system resource in a first set of selected system resources is identified as a function of time, wherein said first set of selected system resources includes one or more of the following: system resources that will cause a stall condition if unavailable, architectural state of the golden model, general purpose registers, special purpose registers, load/store buffer, utilization of execution units, pending control branches, and pending exceptions, said resource tracker further generates a first list set and a second list set, wherein said first list set comprises one or more time-based lists indicating the status of each resource within said first set of system resources, wherein said second list set comprises one or more time-based lists indicating the status of each system resource within a second set of system resources, wherein said second set of system resources includes one or more of the following system resources: physical memory system, virtual memory system, cache, system busses, and interrupts generated, said first list set and said second list set are provided as a test output;

providing a first plurality of resource-related data structures that comprises information relating to the required resource utilization of each instruction supported by the processor system under test, said resource tracker uses said first plurality of resource-related data structures to generate said hazard queue; and providing a second plurality of resource-related data structures that indicates current availability of each system resource within said first set of selected system resources, wherein during each processor cycle, said resource tracker updates said hazard queue and each said resource related data structure within said second plurality that corresponds to a system resource that changes state during the current processor cycle.

29. A method that dynamically tracks the status of selected system resources of the golden model in a dynamic pseudo-random test generator that generates tests for processor systems, comprising:

generating a hazard queue using a resource tracker, wherein the availability of each system resource in a first set of selected system resources is identified as a function of time, wherein said first set of selected system resources includes one or more of the following: system resources that will cause a stall condition if unavailable, architectural state of the golden model, general purpose registers, special purpose registers, load/store buffer, utilization of execution units, pending control branches, and pending exceptions, said resource tracker further generates a first list set and a second list set, wherein said first list set comprises one or more time-based lists indicating the status of each resource within said first set of system resources, wherein said second list set comprises one or more time-based lists indicating the status of each system resource within a second set of system resources, wherein said second set of system resources includes one or more of the following system resources: physical memory system, virtual memory system, cache, system busses, and interrupts generated, said first list set and said second list set are provided as a test output;

generating a first plurality of resource-related data structures that comprises information relating to the required resource utilization of each instruction supported by the processor system under test, said resource tracker uses said first plurality of resource-related data structures to generate said hazard queue; and generating a second plurality of resource-related data structures that indicates current availability of each system resource within said first set of selected system resources and during each processor cycle, updating said hazard queue and each said resource related data structure within said second plurality that corresponds to a system resource that changes state during the current processor cycle.

30. A program storage device readable by a computer that tangibly embodies a program of instructions executable by the computer to perform a method that dynamically tracks the status of selected system resources of the golden model in a dynamic pseudo-random test generator that generates tests for processor systems, comprising:

generating a hazard queue using a resource tracker, wherein the availability of each system resource in a first set of selected system resources is identified as a function of time, wherein said first set of selected system resources includes one or more of the following: system resources that will cause a stall condition if unavailable, architectural state of the golden model, general purpose registers, special purpose registers, load/store buffer, utilization of execution units, pending control branches, and pending exceptions, said resource tracker further generates a first list set and a second list set, wherein said first list set comprises one or more time-based lists indicating the status of each resource within said first set of system resources, wherein said second list set comprises one or more time-based lists indicating the status of each system resource within a second set of system resources, wherein said second set of system resources includes one or more of the following system resources: physical memory system, virtual memory system, cache, system busses, and interrupts generated, said first list set and said second list set are provided as a test output;

generating a first plurality of resource-related data structures that comprises information relating to the required resource utilization of each instruction supported by the processor system under test, said resource tracker uses said first plurality of resource-related data structures to generate said hazard queue; and generating a second plurality of resource-related data structures that indicates current availability of each system resource within said first set of selected system resources and during Mach processor cycle, updating said hazard queue and each said resource related data structure within said second plurality that corresponds to a system resource that changes state during the current processor cycle.

* * * * *